US006480406B1

(12) United States Patent
Jin et al.

(10) Patent No.: US 6,480,406 B1
(45) Date of Patent: Nov. 12, 2002

(54) CONTENT ADDRESSABLE MEMORY CELL

(75) Inventors: Bo Jin, Campbell, CA (US); Manoj Roge, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/934,813

(22) Filed: Aug. 22, 2001

(51) Int. Cl.$^7$ ............................................... G11C 15/00
(52) U.S. Cl. ......................................... 365/49; 365/154
(58) Field of Search ....................... 365/49, 154, 189.02, 365/189.07, 189.11

(56) References Cited

U.S. PATENT DOCUMENTS

| 5,226,005 | A | * | 7/1993 | Lee et al. | ............... | 365/189.07 |
| 5,802,567 | A | * | 9/1998 | Liu et al. | ........................ | 700/2 |
| 6,208,544 | B1 | * | 3/2001 | Beadle et al. | .................. | 365/49 |
| 6,320,777 | B1 | * | 11/2001 | Lines et al. | ............ | 365/189.07 |

OTHER PUBLICATIONS

MUSIC Semiconductors, "What is CAM (Content–Addressable Memory)?" Sep. 1998, pp. 1–4.
Gibson, "Forwarding Schemes," Netronics, Oct. 2000, pp. 40, 42–45.
SiberCore Technologies, "SiberCAM™ Application Note," pp. 1–3.
Ichiriu, "High Performance Layer 3 Forwarding," © 2000 NetLogic Microsystems, Inc., pp. 1–6.
MOSAID Technologies, Inc., "The Next Generation of Content Addressable Memories," Sep. 1999, pp. 1–7.

* cited by examiner

Primary Examiner—Richard Elms
Assistant Examiner—Anh Phung
(74) Attorney, Agent, or Firm—Kevin L. Daffer; Conley, Rose & Tayon P.C.

(57) ABSTRACT

Architecture, circuitry, and methods are provided for producing a content addressable memory (CAM). The CAM includes one or more CAM cells arranged in an array. Each CAM cell is symmetrical about its x- and y-axis to form rows and columns of the array. Additionally, each CAM cell can use either SRAM or DRAM storage cells implemented in either a binary or ternary arrangement. If the CAM cell is a ternary SRAM design, then the cell size is no more than 4 microns by 1-½ microns, assuming a 0.15 micron critical dimension. Critical dimension is noted as the smallest resolvable size for the particular process being employed. The CAM cell utilizes a selection circuitry that will disable the compare circuit during times when a compare operation is not being performed. This will ensure the compare circuit will not consume power during, for example, a read or write operation. Each CAM cell uses no more than eight conductors per cell, wherein the conductors are of minimum width and pitch arranged co-planar on a single metal layer. Another metal layer utilizes local interconnects and a pair of conductors which carry the differential bit lines and compare lines. The local interconnects do not extend across the entire cell and, therefore, are localized to only a small region of a cell to effectuate power and ground supplies to the CAM cell.

14 Claims, 3 Drawing Sheets

CONTENT ADDRESSABLE MEMORY CELL

BACKGROUND OF THE INVENTION

1. Field of the Invention

This invention relates to semiconductor memory and, more particularly, to a content addressable memory (CAM) cell design that employs straight polycrystalline silicon ("polysilicon") word lines and no more than two metal layers, is relatively small and symmetrical in layout, and consumes minimal power during read and write operations.

2. Description of the Related Art

The following descriptions and examples are not admitted to be prior art by virtue of their inclusion within this section.

Semiconductor memory is generally configured upon a substrate as an array of storage cells. Random access memory (RAM) is a special type of semiconductor memory than can examine stored data within one storage cell independent of data within another storage cell. Reading data from or writing data to a RAM involves first addressing the particular storage cell of interest. Accordingly, a user will supply an address to the array for selecting one or more storage cells, and then read to or write from the addressed storage cells.

The efficiency by which a user can access information within a RAM is somewhat dependent on the address bus size. For example, an 8-bit bus can address 256 storage cells in random fashion. Depending on the size of the RAM, multiple accesses may be needed to address the storage cell of interest.

In addition to its depth, RAM memory accesses limited by the number of address lines employed, and the size of each RAM cell is dependent on whether the memory device is a dynamic RAM or static RAM. A static RAM or SRAM uses six transistors per cell. Four transistors are cross-coupled to form a bi-stable latch, and two transistors are used to alter or read out the state of bits stored in the bi-stable latch. An SRAM cell is larger in size than the typical one-transistor dynamic RAM (or DRAM). Unfortunately, however, the stored bit in the DRAM cell must be periodically restored or refreshed.

Data is often organized within the SRAM or DRAM storage cells in an organized, or structured fashion. For example, bursts of data are stored in adjacent word cells so they can be quickly accessed by the address bus. However, multiple accesses may be needed to determine the location of data within the RAM device.

Contrary to DRAMs and SRAMs content addressable memories (CAMs) do not store data in any structured fashion. The locations at which data is stored within CAM can be merely random, where the data can be written directly into the first empty location within the CAM. Once data is stored in CAM, it can be found by comparing every bit in the CAM memory cells with data placed in a comparand register. If a match exists for every bit stored in a particular location within the CAM corresponding to every bit in the comparand, a match line is asserted. A priority encoder can then sort out which matching location among multiple match lines has the top priority.

CAM devices are unique in that a user generally supplies the data and receives back an address for that data. Because the CAM does not require address lines to find data, the depth of the CAM can be extended as far as desired—well beyond the depth of a RAM.

A CAM device is useful in any application requiring fast searches of a database, lists, or pattern, and supplies heightened performance advantages over other memory search algorithms, such as binary or tree-based searches or look-aside tag buffers. Currently, CAMs are particularly well suited for handling packet protocols, such as TCP/ IP protocols employed in packet processors that are used to route information across the an intranet or internet. These useful functions, however, are limited based on the sheer size of a CAM cell relative to SRAM or DRAM cells. Typically, each CAM cell must also have exclusive NOR circuitry. The exclusive NOR circuit is used to perform the compare data stored in the comparand register with data in the storage cell. Depending on whether the CAM cell is a binary or ternary CAM cell, additional transistors may be needed to store masked bits or "don't care" bits. For example, a CAM cell based on the SRAM platform may require more than 16 transistors per cell compared to the six transistor arrangement of a non-CAM, SRAM cell. In addition to its large size, many CAM cells multiplex the bit lines and compare lines. Whenever the CAM cell tries to read or write a bit, activity upon the bit line may cause periodic power consumption within the exclusive NOR compare circuitry. For example, the bit line and stored data within the CAM cell may temporarily transition, such that when placed on the gate conductors of the exclusive NOR series-connected transistors, transient connection between power and ground may occur. This condition could persist for a relatively long period of time during the read or write cycles.

It would be advantageous to implement an improved CAM cell design that is relatively small in size, employs minimal transistors, is symmetric in layout, and consumes minimal power during read and write operations. The desired CAM cell should advantageously use a minimal number of processing layers, and preferably use a minimal number of conductive layers. By reducing the number of layers within the manufacturing process, substantial cost savings and manufacturing throughput can be had.

SUMMARY OF THE INVENTION

The problems outlined above are in large part solved by an improved content addressable memory device containing a plurality of content addressable memory cells. Each cell preferably includes a compare circuit and a selection circuit. The selection circuit may include a multiplexer, where the multiplexer is used to selectably couple power or ground to the compare circuit depending on whether the memory cell is servicing a read/write operation or a compare operation. During times when a read/write operation occurs, the multiplexer will forward power to the compare circuit to ensure that no matter what voltage level is placed on the bit line, the logic value on bit line forwarded to one of the exclusive NOR transistors of the compare circuit will not cause a transient low resistive state between the match line and the node on which power is coupled. The match line is normally placed in a pull-up condition. If the common node on the other side of the series-connected transistors of the exclusive NOR arrangement is also at power, then there can be no temporary low resistance path between power and ground. Accordingly, during a read or write operation, having both ends of the series-connected transistors connected to power will substantially eliminate power consumption within the compare circuit during the read and write operations.

The selection circuit can also be used to selectively place ground onto the compare circuit during a compare operation. In this manner, the series-connected transistors of the exclusive NOR configuration have power and ground connected at the opposing ends of the series-connected transistors. The match line is pulled to power, while the common node of the compare circuit is placed at ground, a combination of both will render the compare circuit active only during the compare operation.

The selection circuit can therefore sense when the CAM cell is undergoing a read/write operation or a compare operation. Depending on which operation is being undertaken, the selection circuit will enable either a power supply or a ground supply to be placed on the common node, or source node, of the series-connected pair of transistors.

According to another embodiment, the CAM device includes a plurality of CAM cells arranged in an array across a semiconductor substrate. Each row of memory cells can be formed by rotating adjacent horizontally extending cells within the row about a y-axis extending vertically through the center of the memory cells. A column of memory cells can be formed by rotating adjacent vertically extending cells within the column about an x-axis extending horizontally through the memory cells. In this fashion, the neighboring memory cell to the immediate right of the previous memory cell can be formed by duplicating by rotating the previous cell about the y-axis, and then placing the rotated memory cell so that it abuts the rightmost boundary of the previous memory cell. This process is repeated across the substrate to form a row of memory cells. The same can be said for forming a column of memory cells. A previous memory cell can be extended upward to form a column by taking the previous memory cell and rotating it about the x-axis to form a duplicative memory cell that is placed directly above the previous memory cell and which abuts the topmost boundary of the previous memory cell. This process is repeated to form the entire column of memory cells.

Preferably, the size of each memory cell within the array of memory cells is less than approximately 4 microns by 1.5 microns for gate lengths (or critical dimensions) of approximately 0.15 micron. As critical dimensions increase or decrease, the cell size will increase or decrease proportionally. For example, if the critical dimension is 0.1 micron instead of 0.15 micron, then not only would critical dimension decrease by approximately 33%, but also the corresponding cell would decrease by approximately 33% in each direction. The opposite would occur if the critical dimension increases.

The array of memory cells are preferably interconnected using local and global metal, or metal alloy conductors. The conductors can be made from any metallic substance, such as copper, aluminum, etc. Preferably metal interconnection is effectuated on no more than two metal layers. Each memory cell comprises no more than eight metal conductors on a first metal layer, and comprises two bit lines or compare lines on a second metal layer. The eight metal lines on the first metal layer extend across the entire cell, and the two bit/compare lines also extend across the entire cell. The eight metal lines are parallel to each other and extend perpendicular to the bit/compare lines on the second metal layer. Also arranged upon the second metal layer are local metal interconnects. Unlike the bit/compare lines and the eight lines on the first metal layer, the local interconnects do not extend "globally" across the entire cell. The local interconnects are used to route power and ground from conductors on the first metal layer to corresponding vias arranged over active areas configured to receive the power and ground supplies. Thus, the local interconnect within the second metal layer affords use of only a single, globally extending power conductor and a single, globally extending ground conductor per cell. In addition to power and ground conductors, the first metal layer also includes three word lines that are periodically coupled to underlying polycrystalline silicon, or "polysilicon", conductors which form the gates of the pass-through transistors within a row of storage cells. The polysilicon conductor, when programmed to receive power, activate transistors within each storage cell and mask storage cell to access the corresponding stored bits and masked stored bits during a read/write operation. The polysilicon conductor is substantially straight and lies directly beneath the substantially straight data word line, global word line, and mask word line conductors on the first metal layer.

One of the eight conductors within the metal one layer can selectively receive power or ground. In particular, this conductor is coupled to the output of the select circuit, or multiplexer, to receive power or ground depending on whether the enable signal forwarded to the multiplexer enables either power or ground.

According to yet another embodiment, a method is provided for minimizing power consumption within a CAM cell. The method includes applying power to a compare circuit within the memory cell during a first time in which the memory cell is undergoing a read or write operation. Thereafter, ground can be applied to the compare circuit within the memory cell during a second time in which the memory cell is undergoing a compare operation. Of course, if the compare circuitry uses p-channel transistors instead of n-channel transistors, then the multiplexer would apply power, instead of ground, during a compare operation, and would apply ground, instead of power, during a read/write operation. In the example provided, n-channel transistors are used in the compare circuitry.

BRIEF DESCRIPTION OF THE DRAWINGS

Other objects and advantages of the invention will become apparent upon reading the following detailed description and upon reference to the accompanying drawings in which.

Figure 1:
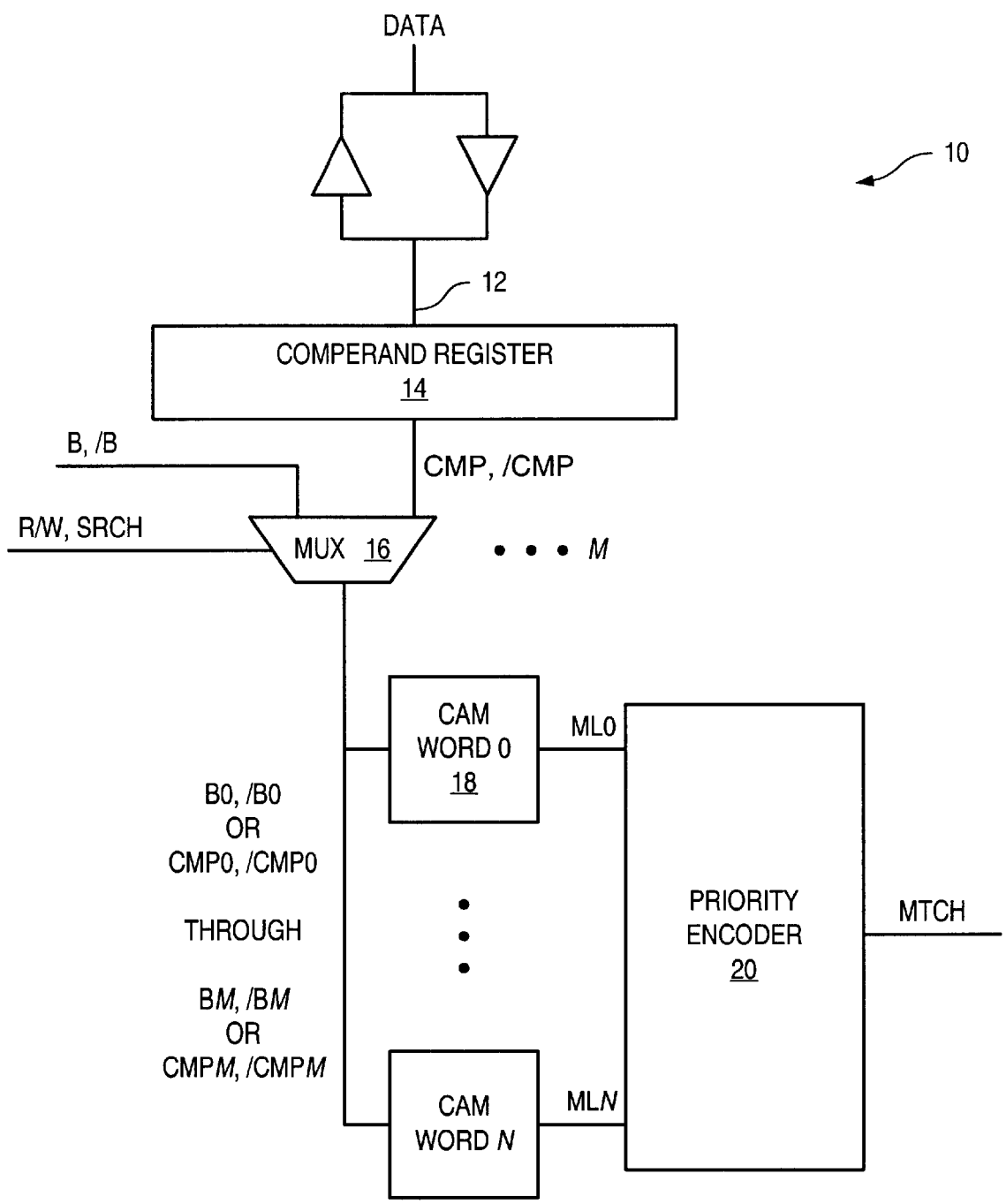
FIG. 1 is a block diagram read, write and search/compare operations performed on a CAM device with a capacity of M bits and N words.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a CAM device 10. Device 10 receives data to be written into storage cells or compared with pre-existing data within storage cells.

The data can also be read from the storage cells. Writing data to, reading data from, and comparing data with data previously stored takes place through an input/ output port 12.

CAM 10 is based on memory cells that have been modified by the addition of extra transistors that compare the state of the bit stored with the state stored in a comparand register 14. During a write or read operation, each CAM cell within CAM 10 acts like a normal SRAM or DRAM cell, with differential bit lines (B and /B) used to latch the value into the cell during a write operation, and sense amplifiers to detect the stored value during a read operation. During a compare operation, differential compare lines (CMP and /CMP) are used in lieu of the differential bit lines.

A multiplexer 16 may be used to forward either the differential bit lines or the differential compare lines onto each of the CAM memory cells. The multiplexer (or select circuit) 16 is enabled to send the differential bit lines during a read or write operation, or to send the differential compare signals during a search or compare operation. The bit lines and compare lines are therefore multiplexed upon corresponding conductors. Thus, each bit within comparand register 14 is placed on a corresponding conductor. For example, if register 14 can store 48 bits, then there might be 48 multiplexers, and 48 differential conductors for each CAM word 18. If there are n number of CAM words, and m number of multiplexers, then CAM device 10 is m bits wide and n words deep.

If every bit within comparand register 14 compares with every bit in one or more CAM words 18, then a match flag is asserted upon a corresponding match line (ML0-N). An asserted match line indicates that the data stored within register 14 was found within one or more CAM cells of one or more CAM words 18. Priority encoder 20 will determine which of the match lines has top priority. If there is more than one match line, then encoder 20 will make available a matching address to the user, noted as the match address (MTCH). CAM device 10 is, therefore, illustrative of data being forwarded to the device, and the address of that data being presented as the output from the device if, indeed, a match occurs. The relatively fast parallel search capabilities of CAM device 10 is particularly useful in any application that requires fast look-ups. For example, routers and switches often employ packet processors that require a look-up of TCP/IP addresses for determining where to forward packetized data. There may be numerous other applications particularly suitable to use of CAM device 10, and essentially any application that requires fast searching and/or pattern recognition would advantageously employ CAM device 10.

Figure 2:
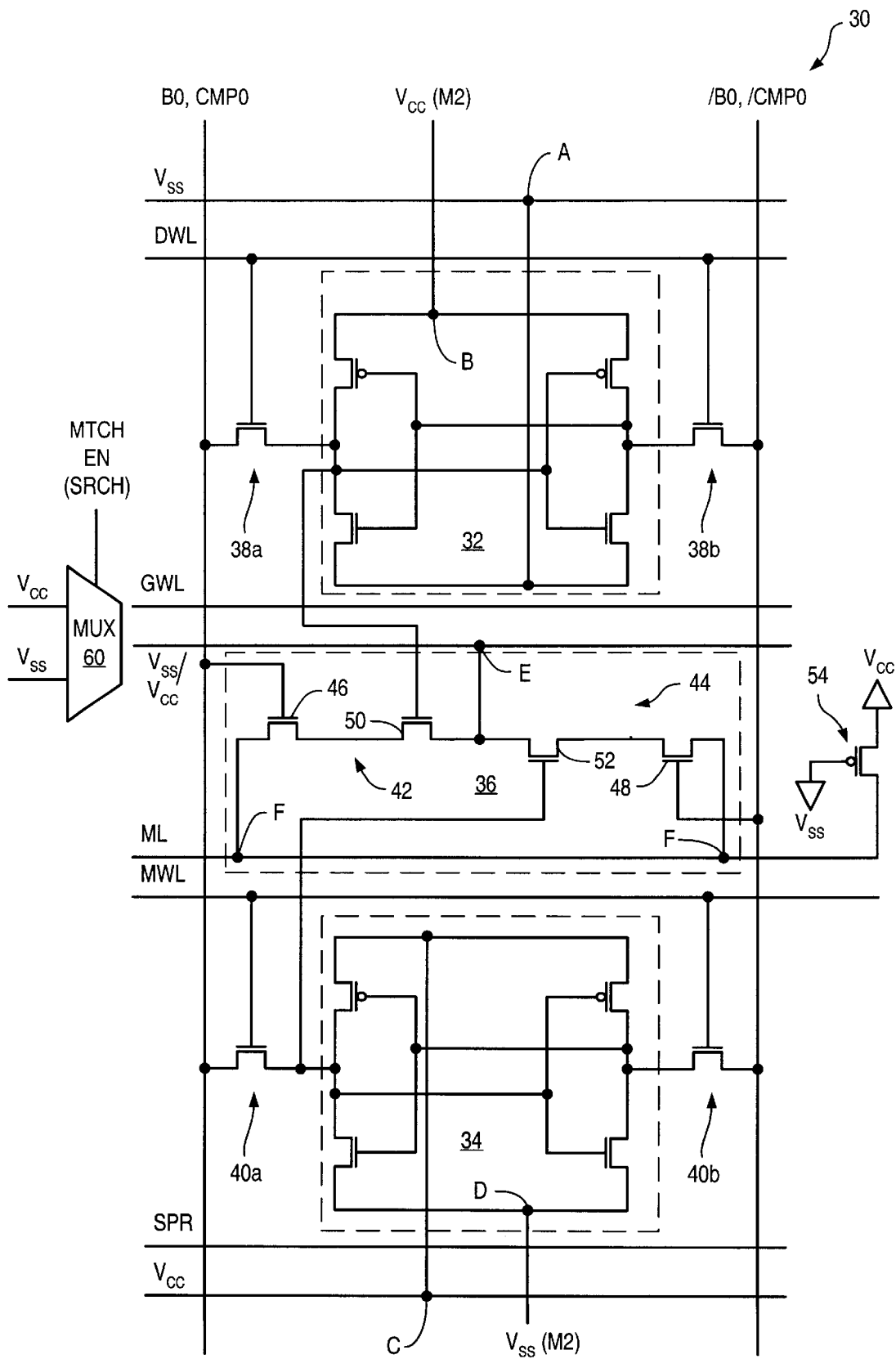
FIG. 2 is a circuit schematic of a single CAM cell portion of a CAM word shown in FIG. 1, wherein the bit lines and compare lines are multiplexed onto the CAM cell depending on whether the CAM cell is undergoing a read/write or compare operation, and wherein the exclusive NOR compare circuitry can be selectively disabled during the read/write operation to minimize power consumption.

FIG. 2 illustrates a CAM cell 30 within CAM word 18 of FIG. 1. Cell 30 is shown to include a first RAM cell 32, a second RAM cell 34, and a compare circuit 36, each of which are shown encompassed by a dashed line. First RAM cell 32, as well as second RAM cell 34, are identical and contain a pair of cross-coupled inverters that form a latch. Accordingly, cells 32 and 34 can be SRAM cells in the example shown. Each inverter includes a PMOS (i.e., p-channel) transistor and an NMOS (i.e., n-channel) transistor connected in series between the power supply (Vcc) and ground (Vss). Accordingly, the cross-connected pair of inverters in each SRAM cell are represented as two pairs of series-connected transistors connected in parallel between ground and power. SRAM cell 32 is used to receive generalized data, whereas SRAM cell 34 receives mask bits.

Implementation of two SRAM cells afford the ability to store don't care bits. Accordingly, cell 30 is shown as a ternary CAM cell that effectively stores three states of information: a logic 1 state, a logic 0 state, and a don't care state for compare operations. Ternary CAM cells, therefore, include mask data stored in the second SRAM cell of each ternary CAM cell. The local mask data will mask the comparison result of the comparand data with the data stored in the first SRAM cell such that the comparison result does not affect the match line. A ternary CAM cell, therefore, offers more flexibility to the user to determine, on an entry-by-entry basis, which bits in a word will be masked during a compare operation.

Although a ternary CAM cell is shown, a binary CAM cell is also contemplated. A binary CAM cell essentially has only the first SRAM cell 32 and the compare circuit 36. Instead of masking various bits in a word line that have been favorably compared with the comparand register, a binary CAM cell simply performs the compare and forwards the match results without any regard to masking certain bits. It is, therefore, contemplated that the present features and layout hereof can be implemented as either a ternary CAM cell or a binary CAM cell, and that FIG. 2 encompasses both.

In addition to encompassing both ternary and binary CAM cells, the present CAM device can also be implemented either using SRAM memory cells or DRAM memory cells. A DRAM memory cell can avoid the cross-coupled inverters and pass-through transistors 38 and 40 shown in FIG. 2. Instead, memory cell 30 can include simply one transistor that would replace cell 32 and pass-through transistors 38a and 38b. The same would apply to cell 34 and pass-through transistors 40a and 40b. If a ternary DRAM CAM cell is to be used, then there would be need for only four transistors within compare circuit 36, and only a single transistor in each of the RAM cells, to form a six transistor ternary DRAM CAM cell 30. Regardless of whether the CAM cell 30 employs DRAM cells or SRAM cells, or is implemented as a binary or ternary configuration, the advantages hereof can be implemented. A ternary SRAM configuration is illustrated only for purposes of showing the relative size of such a cell, and the advantages of minimizing that size would be more acute in a ternary SRAM configuration. Yet, however, a binary DRAM configuration could also have a minimum size configuration when employing the improved layout configuration hereof. For sake of brevity, all the various permutations of binary, ternary, DRAM, or SRAM cells are not shown. However, the advantages and implementations described herein below would apply to any of such multiple configurations.

In addition to the cross-coupled inverters within RAM cells 32 and 34, and the pass-through transistors 38 and 40 attributed to each of such cells, cell 30 also includes compare circuit 36. Compare circuit 36 is shown as two pairs of transistors 42 and 44 coupled in parallel between a common node, labeled as E, and a match line ML having a ode labeled as F. Transistors 46 and 48 receive on their gate conductor the complementary compare signals, and transistors 50 and 52 receive upon their gate conductors outputs from RAM cells 32 and 34, respectively.

If cell 30 were of a binary configuration, then transistor pairs 44 can be discarded, along with transistors 40 and RAM cell 34. Accordingly, if the output bit stored within cell 32 matches the bit within the comparand register, as noted on the compare signal line, the output on the match line ML will be a logic high value in accordance with exclusive NOR function. If the stored value and the comparand register value do not match, a pull-down condition will exist whereby the match line ML is pulled down to Vss placed at the common node E. Normally, match line ML will remain pulled to Vcc unless a comparison does not exist, in which case transistors 46 and 50 will turn on to drive match line ML to the Vss voltage multiplexed upon node E. There are numerous ways in which to pull-up the match line, one way is shown by using a single PMOS transistor 54 having its gate conductor connected to ground (Vss).

If a ternary arrangement is to be achieved, then essentially the same operation as a binary configuration will result. However, in addition to a comparison between the comparand register bit and the bit stored within RAM cell 32, comparison will also result between the comparand register bit and the mask bit stored within RAM cell 34. Thus, not only must the bit stored within RAM cell 32 compare with the comparand register bit, but also the match bit within RAM cell 34 must compare with the comparand register before the match line ML can yield a logic high value or "match." If the mask bit is present and yields a noncompare (i.e., the comparand bit is masked), then a non-match will result. In other words, if the comparand register matches memory, then the match line will remain pre-charged, or if the comparand register does not match masked memory, then the match line will remain pre-charged.

A selection circuit 60, preferably a multiplier, can be used to selectively place either power or ground (Vcc or Vss) upon common node E depending on whether the memory cell is called upon to read/write data or compare data. During a read/write operation, selection circuit 60 will place power upon node E so that node E is essentially the same voltage as node F that has been pulled-up to the power supply. This renders the compare circuit 36 inoperable during read and write operations. During a compare operation, however, selection circuit 60 places a ground supply upon common node E, so that the exclusive NOR functionality of compare circuit 36 can take place. By coupling node E to the power supply during a read/write cycle, cell 30 can be assured that no power dissipation can exist within compare circuit 36 during the read/write cycles. Power consumption can only occur during a compare operation and, more particularly, during a compare operation which yields a mismatch between the comparand register and data stored in RAM cells 32 and 34. Disabling compare circuit 36 during a read/write cycle will prevent any voltage fluctuations on the differential bit lines from inadvertently activating transistors 46 and 48, and thereby forming transient low resistive paths between the pulled-up mask line and the common node E that would normally be configured at ground. By assuring the common node E is not at ground during a read/write cycle, no resistive path can form. Accordingly, selection circuit 60 effectively minimized power consumption within CAM cell 30. When multiplied across the array of CAM cells, substantial power reduction is achieved.

Figure 3:
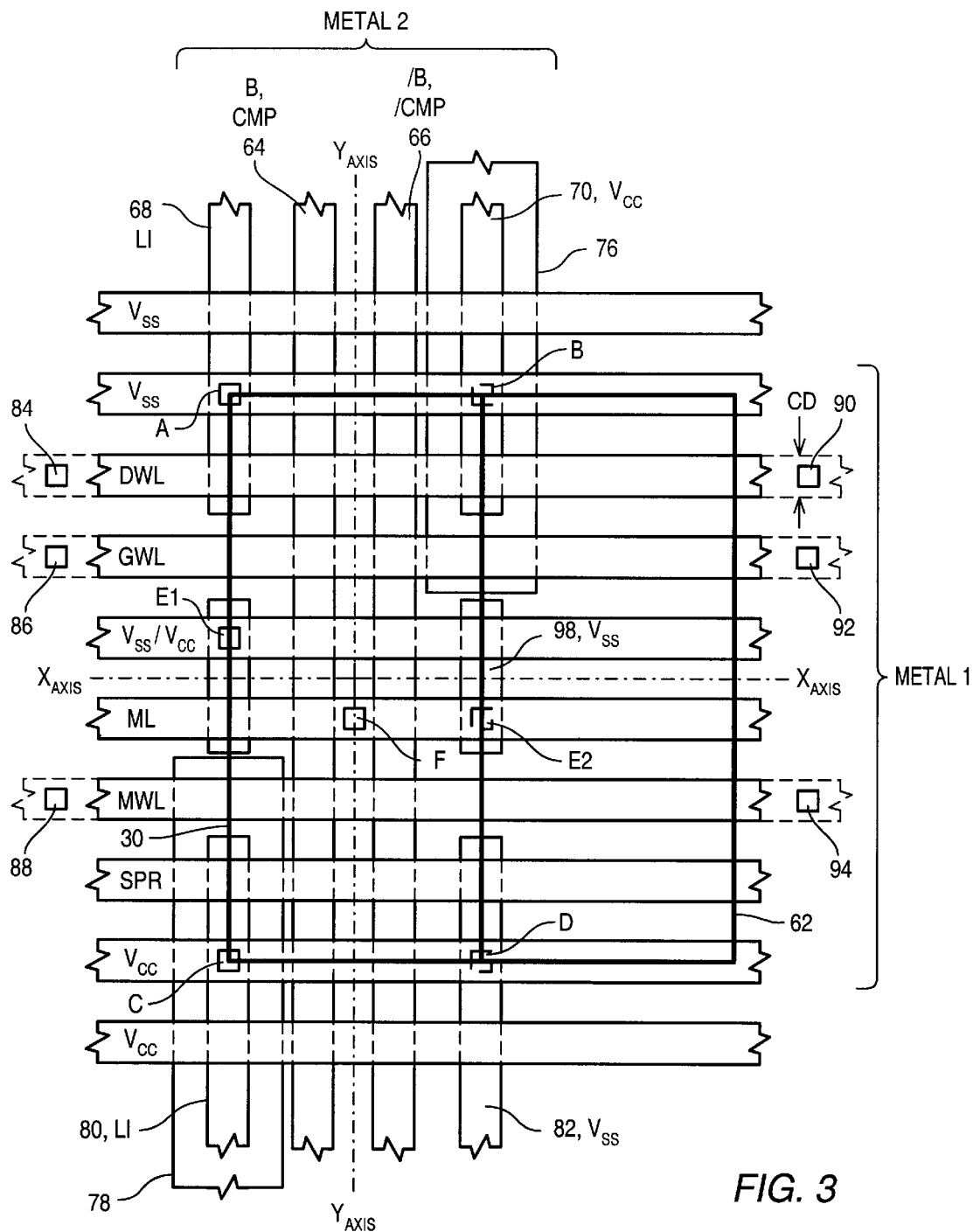
FIG. 3 is a layout of the two layers of metal used to route power and ground to the CAM cell shown as symmetric about the x- and y-axes.

FIG. 3 illustrates the top view layout of a CAM cell 30. In particular the layout of CAM cell 30 includes multiple layers; however, only the metal layers, N-wells, and a few select contact vias are shown. CAM cell 30 is also shown to be repeated across the entire topography of a CAM device. The repeat configuration needed to form a row of cells 30 takes place by rotating cell 30 about its $Y_{AXIS}$, and placing the rotated cell into area 62. The cell in area 62 is then, again, rotated about its $Y_{AXIS}$, and the rotated cell is placed in the next-most location, just to the right of location 62. In this fashion, a row of cells can be formed across the semiconductor substrate. The same can be said when forming a column of cells, wherein cell 30 can be rotated about its $X_{AXIS}$ and placed in the next position just above the position in which cell 30 resides. The $X_{AXIS}$ and $Y_{AXIS}$ are shown to extend through the center point of cell 30. When rotated about the corresponding axis, various connection points of, for example, the rightmost boundary of cell 30 would abut with and thereby connect with the same rightmost boundary conductors that are now placed at the leftmost boundary of the cell just to the right of cell 30. The same applies to connection of the upper boundary to the same upper boundary conductors which, when rotated, become the lower boundary of the cell immediately above cell 30. In this fashion, cell 30 is said to be symmetric about it x- and y-axis, where all conductive and/or non-conductive features of cell 30 line-up at each boundary location to the adjacent cell. The alignment at the boundary is, therefore, guaranteed due to the symmetrical nature by which each CAM cell 30 is laid out by the chip designer.

FIG. 3 illustrates eight conductors configured upon a metal layer, noted as METAL 1. Those conductors include power (Vcc), a spare conductor (SPR), mask word line (MWL), match line (ML), a selectable power/ground line (Vss/Vcc), a global word line (GWL), a data word line (DWL), and a ground line (Vss). The eight conductors are substantially co-planar and parallel to one another across CAM cell 30. Placed upon another layer spaced by a dielectric from METAL 1, are two differential bit/compare lines 64 and 66. Conductors 64 and 66, similar to the eight conductors on METAL 1 layer, are parallel to one another and are equally spaced from each other across the corresponding planar region. Conductors 64 and 66, while spaced by an interlevel dielectric from the conductors on METAL 1 layer, are perpendicular to the eight conductors on METAL 1 layer. Also associated with METAL 2 layer are local interconnects 68 and 70 that extend along a straight axis, but are intermittently placed along that axis. The local interconnects are made of the same metallic materials as those of conductors 64 and 66, and are particularly suited to route power and ground from the overlying conductors to underlying implant areas. Alternatively, the local interconnects can route power and ground up from the underlying implant areas and then over to another implant area using the local interconnect as a highly conductive strap.

Referring to FIGS. 2 and 3 in combination, node A represents a contact between the ground conductor (Vss) on the METAL 1 layer and local interconnect 68. Local interconnect 68 can then forward the ground supply along the local interconnect to another contact which extends downward to the source implant areas of the n-channel, cross-coupled inverter pairs of cell 32. Node B illustrates a contact shown in dashed lines to indicate a contact not with the upper METAL 1 conductor, but a contact between the lower METAL 2 local interconnect 70 and an underlying implant area. Specifically, local interconnect 70 can receive power (Vcc) up through the contact from the underlying source implant of the cross-coupled transistors of cell 32. Thus, even though contact B is shown beneath the ground conductor on METAL 1, the contact and ensuing via is separate from the overlying ground conductor by an interlevel dielectric. Contact vias, therefore, is exclusively between the Vcc conductor on the METAL 2 layer and the source regions of the p-channel transistors of cell 32. Not only does contact B provide power to the p-channel transistors, but also applies power through an n+implant within the n-well 76. Accordingly, power to cell 32 and to the n+implant of well 76 is provided by the local interconnect, and not from the Vcc conductor within METAL 1. This allows for a higher density configuration of cell 30 since an additional Vcc conductor is not needed on METAL 1 layer in the vicinity of contact B.

Contact C functions similar to contact B, in that contact C provides power to the n-well 78 of the p-channel transistors of the cross-coupled inverter pairs within cell 34. In addition, contact C provides the power to those cross-coupled transistor pairs. Power through contact C is derived from the overlying Vcc conductor within METAL 1 layer. As opposed to drawing power from the underlying implant areas, or from a Vcc conductor placed somewhere else on METAL 1 and routed through the local interconnect 80, contact C simply takes power from the overlying Vcc conductor directly above on METAL 1.

Contact D is similar to contact A. However, instead of drawing ground from the overlying conductor, contact D draws ground from the underlying local interconnect which connects somewhere else on that local interconnect 82 to the ground supply, either beneath through an implant area or above through a ground conductor on METAL 1 spaced from contact D.

FIG. 3 illustrates the advantages of using a minimal number of METAL 1 conductors, each having the minimum critical dimension (width) and minimum pitch between conductors. This allows for cell 30 to be as small as possible. In fact, cell 30 is designed to be approximately 4 microns in the y dimension and 1½ microns in the x dimension for critical dimensions or gate lengths of approximately 0.15 micron. As the critical dimension changes, so would the dimension of cell 30. As defined herein, critical dimension is the small resolvable feature size that can be printed upon the integrated circuit topography. Beneath the data word line and global word line on METAL 1 are polysilicon conductors 84 and 86, respectively. Conductors 84 and 86 form the gate conductors of the pass-through transistors 38*a* and 38*b* (shown in FIG. 2). Directly beneath the mask word line on METAL 1 is a polysilicon conductor 88. Conductor 88 forms the gate conductor of the pass-through transistors 40*a* and 40*b* (shown in FIG. 2). Periodically, the overlying metal conductors DWL, GWL, and MWL are connected to the underlying polysilicon conductors through contacts 90, 92, and 94. The contacts can be equally spaced between respective overlying metal conductors and underlying polysilicon conductors to enhance the conductivity of the polysilicon conductor by strapping the polysilicon conductor at approximately every 50–100 memory cells.

Referring again to FIGS. 2 and 3, node E represents a common node that can be connected either to ground or power, depending on the output from multiplexer 60. Node E1 is connected to the overlying, selectable conductor Vss/Vcc of METAL 1 and provides either ground or power to an underlying source region of transistor 50. Node E2 provides either power or ground from the local interconnect 98 and extends that power downward through contact E2 to the underlying source region of transistor 52. Accordingly, the portion near the center of cell 30 is dedicated to the compare circuit 36, with a spaced pair of transistors coupled in series between node E1 and node F, those transistors noted as transistor pairs 42, whereas the spaced transistors coupled in series, and noted as reference numeral 44, are placed between node F and node E2. Node F is dedicated to make contact between the source regions of transistors 46 and 48, and the overlying match line ML of METAL 1. Although not shown, beneath METAL 1 and METAL 2, between contacts E1 and F as well as contacts E2 and F, are respective pairs of gate conductors spaced in series configuration from one another between the match line and the selectable Vss/Vcc supply.

It will be appreciated to those skilled in the art having the benefit of this disclosure that the embodiments described herein are believed to be applicable to either a binary or ternary DRAM or SRAM CAM cell design. The dimensions given for a ternary CAM cell design of 4 microns by 1½ microns could be reduced by approximately 30% in the y direction should a binary SRAM CAM cell be envisioned. Further reduction in size can occur if the cross-coupled inverters in pass-through transistors are replaced by a single transistor. The amount of additional reduction in CAM cell size would be roughly proportional to the number of transistors being removed from the overall topography. Accordingly, the following claims are to be interpreted to embrace all such modifications and changes. Therefore, the specification and drawings are to be regarded in an illustrative rather than a restrictive sense.

What is claimed is:

1. A content addressable memory cell, comprising:

a compare circuit; and a multiplexer adapted to selectively couple power to the compare circuit in lieu of ground during times when the memory cell services a read or write operation.

2. The memory cell as recited in claim 1, wherein the compare circuit comprises an exclusive NOR circuit.

3. The memory cell as recited in claim 2, wherein the exclusive NOR circuit comprises:

a match line coupled to receive a signal that indicates the contents within the memory cell matches data forwarded to the memory cell;

first and second pairs of transistors, wherein each pair is coupled between the match line and a common node, and wherein the common node is coupled to receive power from the multiplexer in lieu of ground during times when the memory cell services the read or write operation.

4. The memory cell as recited in claim 1, wherein the multiplexer includes a pair of input conductors upon which a power supply and a ground supply are connected, and wherein the multiplexer further includes an enable conductor upon which signals that instruct the memory to read or write data are connected.

5. The memory cell as recited in claim 4, wherein the signals are produced by a controller during times when the memory cell is called upon to service the read or write operation.

6. A content addressable memory cell, comprising:

a compare circuit; and a multiplexer adapted to selectively couple ground to the compare circuit in lieu of power during times when the memory cell services a compare operation.

7. The memory cell as recited in claim 6, wherein the compare circuit comprises an exclusive NOR circuit.

8. The memory cell as recited in claim 7, wherein the exclusive NOR circuit comprises:

a match line coupled to receive a signal that indicates the contents within the memory cell matches data forwarded to the memory cell;

first and second pairs of transistors, wherein each pair is coupled between the match line and a common node, and wherein the common node is coupled to receive ground from the multiplexer in lieu of power during times when the memory cell services the compare operation.

9. The memory cell as recited in claim 6, wherein the multiplexer includes a pair of input conductors upon which a power supply and a ground supply are connected, and wherein the multiplexer further includes an enable conductor upon which a signal that instruct the memory to compare data is connected.

10. The memory cell as recited in claim 9, wherein the signal is produced by a controller during times when the memory cell is called upon to compare data forwarded to the memory cell with data previously stored in the memory cell.

11. The memory cell as recited in claim 6, wherein the multiplexer is further adapted to couple ground to the compare circuit in lieu of power during times when the memory cell is called upon to service the compare operation.

12. A method for minimizing power consumption within a content addressable memory cell, comprising:

applying power to a compare circuit within the memory cell during a first time in which the memory cell is undergoing a read or write operation; and applying ground to the compare circuit within the memory cell during a second time in which the memory cell is undergoing a compare operation.

13. The method as recited in claim 12, wherein applying power during the first time comprises detecting a signal which initiates the read or write operation and forwarding the signal to a multiplexer for placing a power supply signal forwarded to the multiplexer input upon the compare circuit.

14. The method as recited in claim 12, wherein applying ground during the second time comprises detecting a signal which initiates the compare operation and forwarding the signal to a multiplexer for placing a ground supply signal forwarded to the multiplexer input upon the compare circuit.

* * * * *